United States Patent
Ishikawa et al.

(10) Patent No.: US 11,996,668 B2
(45) Date of Patent: May 28, 2024

(54) LASER IGNITION DEVICE

(71) Applicant: DENSO CORPORATION, Kariya (JP)

(72) Inventors: Tomohiro Ishikawa, Kariya (JP); Kenji Kanehara, Kariya (JP)

(73) Assignee: DENSO CORPORATION, Kariya (JP)

( * ) Notice: Subject to any disclaimer, the term of this patent is extended or adjusted under 35 U.S.C. 154(b) by 897 days.

(21) Appl. No.: 17/027,870

(22) Filed: Sep. 22, 2020

(65) Prior Publication Data

US 2021/0003108 A1 Jan. 7, 2021

Related U.S. Application Data

(63) Continuation of application No. PCT/JP2019/005546, filed on Feb. 15, 2019.

(30) Foreign Application Priority Data

Mar. 23, 2018 (JP) .................. 2018-056611

(51) Int. Cl.
| | | |
|---|---|---|
| *H01S 3/10* | (2006.01) | |
| *H01S 3/04* | (2006.01) | |
| *H01S 3/06* | (2006.01) | |
| *H01S 3/094* | (2006.01) | |
| *H01S 3/0941* | (2006.01) | |
| *F02P 23/04* | (2006.01) | |
| *G02B 5/00* | (2006.01) | |

(Continued)

(52) U.S. Cl.
CPC .......... *H01S 3/0608* (2013.01); *H01S 3/0401* (2013.01); *H01S 3/061* (2013.01); *H01S 3/094053* (2013.01); *H01S 3/094061* (2013.01); *H01S 3/09415* (2013.01); *F02P 23/04* (2013.01); *G02B 5/001* (2013.01); *H01S 3/005* (2013.01); *H01S 3/0092* (2013.01); *H01S 3/091* (2013.01); *H01S 2301/203* (2013.01)

(58) Field of Classification Search
CPC ...... H01S 3/0608; H01S 3/0401; H01S 3/061; H01S 3/094053; H01S 3/094061; H01S 3/09415; H01S 3/005; H01S 3/0092; H01S 3/091; H01S 2301/203
See application file for complete search history.

(56) References Cited

U.S. PATENT DOCUMENTS

| | | | | |
|---|---|---|---|---|
| 2008/0264371 | A1* | 10/2008 | Taido ............... | F02P 15/00 123/143 B |
| 2010/0282195 | A1* | 11/2010 | Herden ............. | F02P 13/00 123/143 B |

(Continued)

FOREIGN PATENT DOCUMENTS

| | | |
|---|---|---|
| JP | H07-131092 | 5/1995 |
| JP | 2006-242036 | 9/2006 |
| JP | 2008-258446 | 10/2008 |

*Primary Examiner* — Kinam Park
(74) *Attorney, Agent, or Firm* — Nixon & Vanderhye P.C.

(57) ABSTRACT

A laser ignition device includes a laser oscillation optical system that produces pulsed laser light, a condensing optical element that condenses the pulsed laser light into a combustion chamber, a housing that internally contains the condensing optical element, and an optical window that is provided distally with respect to the condensing optical element in the housing and transmits the pulsed laser light. The pulsed laser light is shaped as a ring around an optical axis at least at a light passage position in the optical window.

1 Claim, 11 Drawing Sheets

(51) Int. Cl.
*H01S 3/00* (2006.01)
*H01S 3/091* (2006.01)

(56) References Cited

U.S. PATENT DOCUMENTS

| | | | |
|---|---|---|---|
| 2013/0022060 A1* | 1/2013 | Gaborel | G02B 6/4296 |
| | | | 372/6 |
| 2013/0112164 A1* | 5/2013 | Morishima | F02P 23/04 |
| | | | 123/143 B |
| 2013/0206091 A1 | 8/2013 | Kanehara et al. | |
| 2013/0276738 A1* | 10/2013 | Hartke | H01S 3/1022 |
| | | | 123/143 B |
| 2016/0223721 A1* | 8/2016 | Kiontke | G02B 27/005 |
| 2019/0120219 A1* | 4/2019 | Calomeris | H05H 1/2406 |

* cited by examiner

LASER IGNITION DEVICE

CROSS-REFERENCE TO RELATED APPLICATION

The present application is a continuation application of International Application No. PCT/JP2019/005546, filed Feb. 15, 2019, which claims priority to Japanese Patent Application No. 2018-056611, filed Mar. 23, 2018. The contents of these applications are incorporated herein by reference in their entirety.

BACKGROUND

1. Technical Field

The present disclosure relates to a laser ignition device.

2. Related Art

Igniters for internal combustion engines in automobiles include a laser ignition device that uses a laser beam to ignite a mixture of air and fuel. Such a laser ignition device includes, in its housing, a condensing optical element that condenses a laser beam into the combustion chamber.

SUMMARY

The present disclosure provides a laser ignition device. As an aspect of the present disclosure, a laser ignition device includes a laser oscillation optical system, a condensing optical element, a housing, and an optical window. The laser oscillation optical system produces pulsed laser light. The condensing optical element condenses the pulsed laser light into a combustion chamber. The housing internally contains the condensing optical element. The optical window is provided distally with respect to the condensing optical element in the housing and transmits the pulsed laser light. The pulsed laser light is shaped as a ring around an optical axis at least at a light passage position in the optical window.

DETAILED DESCRIPTION OF THE PREFERRED EMBODIMENTS

Figure 1:
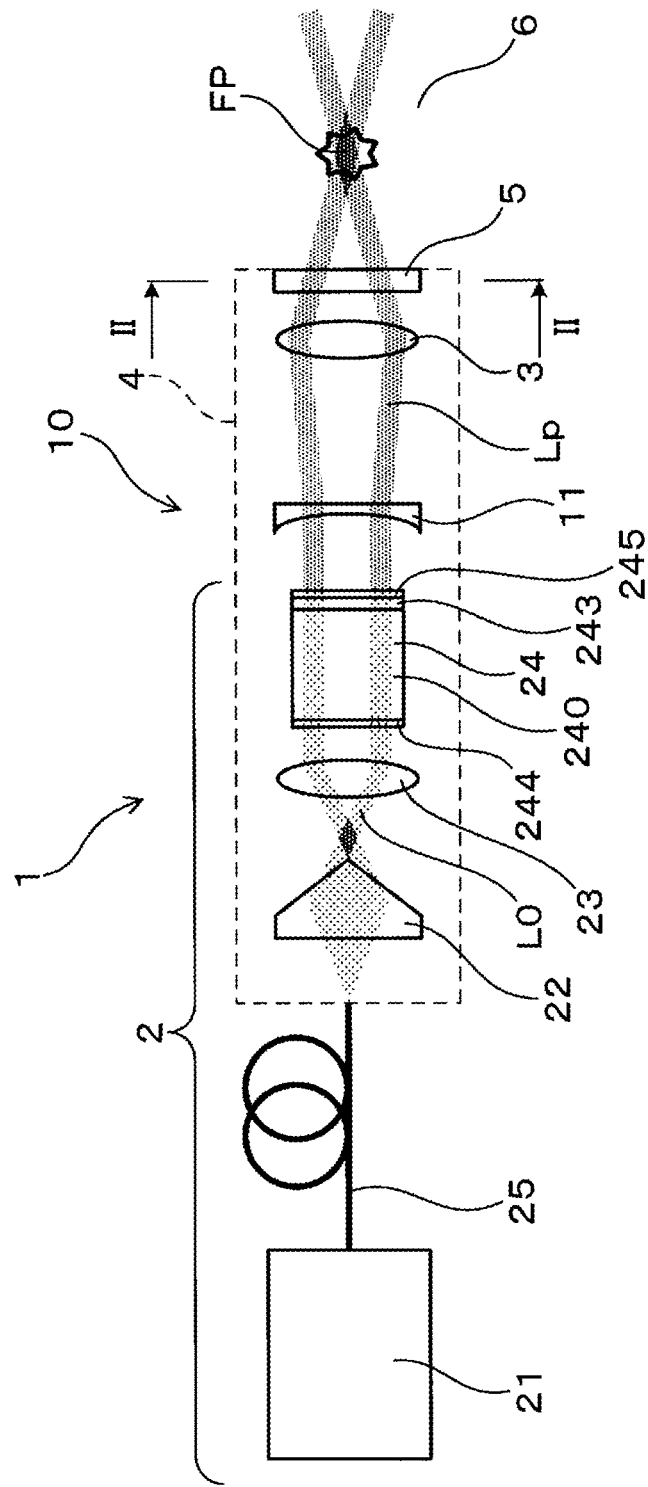
FIG. 1 is a schematic diagram illustrating a laser ignition device according to a first embodiment.

As an example, JP 2013-164042 A (Japanese Unexamined Patent Application Publication No. 2013-164042) discloses a laser ignition device including a housing provided with, distally with respect to the condensing optical element, an optical window that transmits a laser beam. The optical window is, for example, formed of transparent glass. The optical window guards the condensing optical element against the heat in the combustion chamber, pressure, and contamination by fuel or soot.

The optical window is provided at a position facing the combustion chamber. Thus, deposits such as metallic oxide generated in the combustion chamber may adhere to or accumulate on the outer face of the optical window. In such a case, the optical window may have lower laser beam transmittance, causing a reduction in the intensity of laser beams condensed into the combustion chamber.

The present inventors have thus researched the mechanism of adhesion and accumulation of deposits on the optical window. The optical window becomes hot when subjected to combustion gas in the combustion chamber. The inventors have found that deposits are generated when engine oil that results in deposits adheres to the hot optical window and the oil is burned and stuck.

The optical window is fixed with its outer edge on the distal end of the housing. The optical window thus has an outer peripheral area that tends to easily dissipate heat through the housing. Accordingly, the outer peripheral area of the optical window is less likely to be too hot, while the central area is likely to be hotter. As a result, the optical window is more likely to have adhesion and accumulation of deposits on the central area than on the outer peripheral area.

On the basis of the mechanism and the tendency of deposit generation, even in the case of adhesion or accumulation of deposits, a reduction in the intensity of light condensed into the combustion chamber can be prevented depending on the laser beam passage position in the optical window.

It is an object of the present disclosure to provide a laser ignition device capable of preventing a reduction in the intensity of light condensed into the combustion chamber.

An aspect of the present disclosure is a laser ignition device including:

a laser oscillation optical system that produces pulsed laser light;

a condensing optical element that condenses the pulsed laser light into a combustion chamber;

a housing that internally contains the condensing optical element; and an optical window that is provided distally with respect to the condensing optical element in the housing and transmits the pulsed laser light.

The pulsed laser light is shaped as a ring around an optical axis at least at a light passage position in the optical window.

The laser ignition device allows the pulsed laser light to be shaped as a ring around the optical axis at least at the light passage position in the optical window. The ring shape enables the pulsed laser light to pass outside the central area of the optical window (i.e., near the optical axis).

As described above, the optical window is more likely to have adhesion or accumulation of deposits on the central area of the optical window than on the outer peripheral area. In other words, deposits are less likely to adhere to or accumulate on the outer peripheral area of the optical window. The pulsed laser light is thus shaped as a ring so as to pass through the outer peripheral area. As a result, even if deposits adhere to the optical window, the intensity of light condensed into the combustion chamber can be prevented from lowering.

Thus, the above aspect provides a laser ignition device capable of preventing a reduction in the intensity of light condensed into the combustion chamber.

The above and other objects, features, and advantages of the present disclosure will be clearly apparent from the detailed description provided below with reference to the accompanying drawings.

First Embodiment

An embodiment of a laser ignition device will now be described with reference to FIGS. 1 to 7.

A laser ignition device 1 according to this embodiment, as illustrated in FIG. 1, includes a laser oscillation optical system 2, a condensing optical element 3, a housing 4, and an optical window 5.

The laser oscillation optical system 2 is an optical system that oscillates pulsed laser light Lp. The condensing optical element 3 is an optical element that condenses the pulsed laser light Lp into a combustion chamber 6. In this embodiment, the condensing optical element 3 is a condenser lens. The housing 4 internally contains the condensing optical element 3. The optical window 5 is provided distally with respect to the condensing optical element 3 in the housing 4 and transmits the pulsed laser light Lp.

Figure 2:
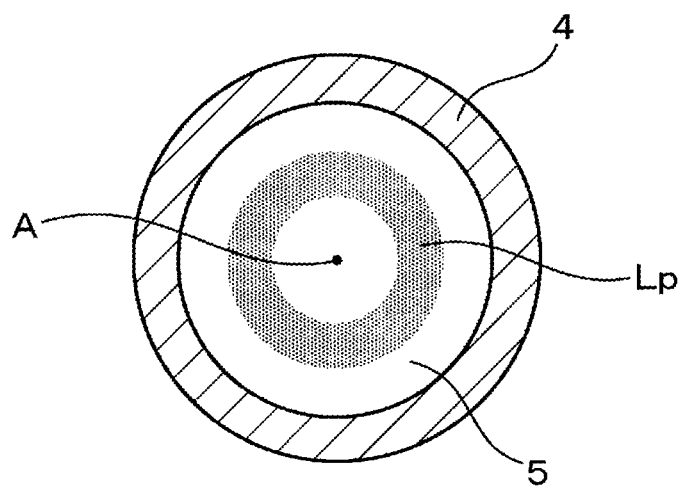
FIG. 2 is a diagram corresponding to a cross-sectional view taken in the arrow direction of line II-II in FIG. 1, showing a pulsed laser light passage position in an optical window according to the first embodiment.

The laser ignition device 1 allows the pulsed laser light Lp to be shaped as a ring around an optical axis as illustrated in FIG. 2 at least at a light passage position in the optical window 5. In this figure, point A indicates the optical axis. In this embodiment, the pulsed laser light Lp is formed as a circle with the optical axis for its center.

Figure 3:
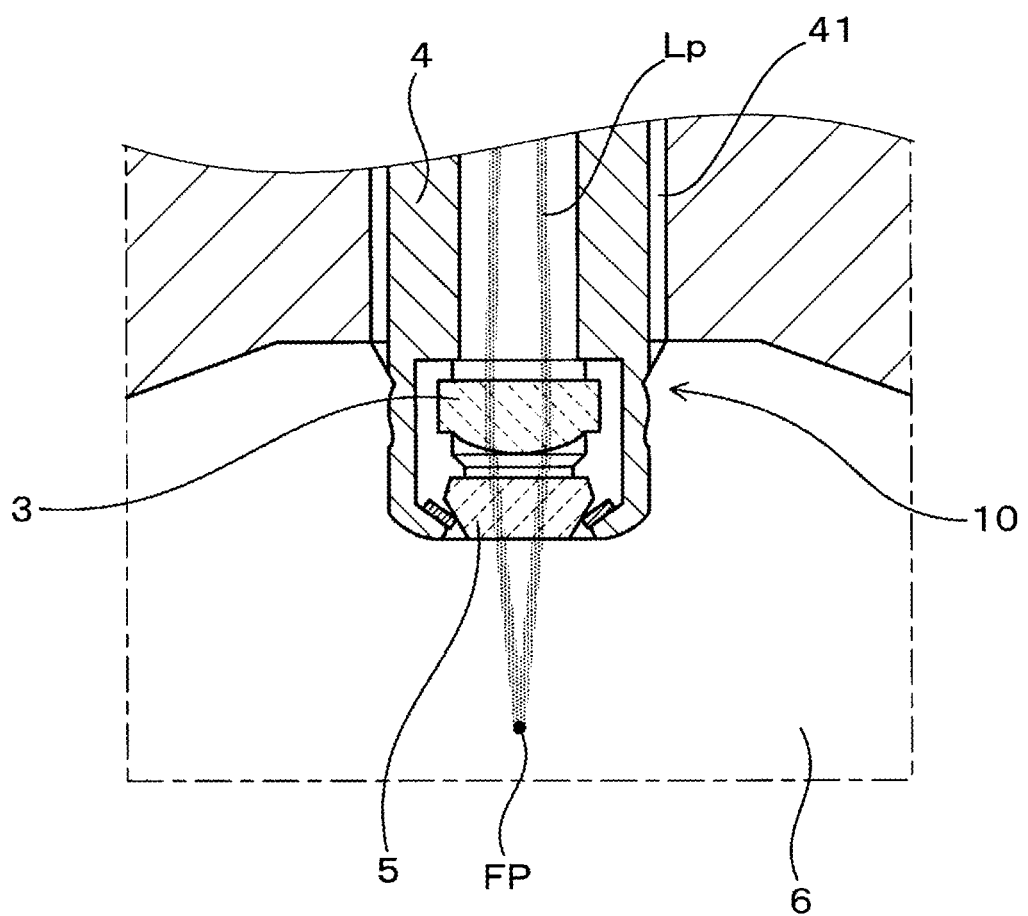
FIG. 3 is a cross-sectional diagram of a part of the laser ignition device in a plane including an optical axis according to the first embodiment.

In this embodiment, the laser ignition device 1 is fitted to an internal combustion engine for a vehicle. As illustrated in FIG. 3, the laser ignition device 1 is fitted to an internal combustion engine and used with the distal end of a laser spark plug 10 exposed in the combustion chamber 6. The laser ignition device 1 is configured to condense the pulsed laser light Lp in the combustion chamber 6 of the internal combustion engine to ignite a mixture of air and fuel.

As illustrated in FIG. 3, the laser spark plug 10 at least includes the housing 4 having a mounting screw 41 on its outer peripheral surface, the condensing optical element 3 contained in the housing 4, and the optical window 5 fitted to the distal end of the housing 4. In the axial direction of the laser spark plug 10, the side facing the combustion chamber 6 is referred to as a distal side, and the opposite side is referred to as a proximal side. The axial direction of the laser spark plug 10 corresponds to the direction of the optical axis of the pulsed laser light Lp.

The housing 4 is a substantially cylindrical member made of metal. The housing 4 holds the optical window 5 on its outer edge. The condensing optical element 3, which is proximal with respect to the optical window 5, is held inside the housing 4.

As illustrated in FIG. 1, in this embodiment, the laser oscillation optical system 2 includes an axicon lens 22. The axicon lens 22 is a lens that transforms incident light into ring-shaped outgoing light surrounding the optical axis.

It is noted that light described as being shaped as a ring such as "ring-shaped outgoing light" means that its cross section orthogonal to the optical axis is ring-shaped, or circular, unless otherwise noted. The ring or the circle may not be annular, but may be, for example, substantially oval or substantially polygonal.

The ring-shaped light may have some light intensity near the optical axis as long as the light has an intensity distribution in which the light intensity peaks in an outer peripheral area distant from the optical axis, rather than near the optical axis. More specifically, although an intensity distribution described later and shown in FIG. 6 has zero light intensity near the optical axis, light intensities may not be limited to this intensity distribution. The central area may have some light intensity as long as the light intensity is much lower than that of the outer peripheral area.

As illustrated in FIG. 1, the laser oscillation optical system 2 includes an excitation light source 21, the axicon lens 22, a collimator lens 23, and a laser resonator 24. The excitation light source 21 generates excitation light L0. The axicon lens 22 receives and transforms the excitation light L0 into ring-shaped outgoing light. The collimator lens 23 transforms the outgoing light into collimated light parallel with the optical axis. The laser resonator 24 is excited by the incident excitation light L0, which is the collimated light, to emit pulsed laser light Lp.

Figure 4:
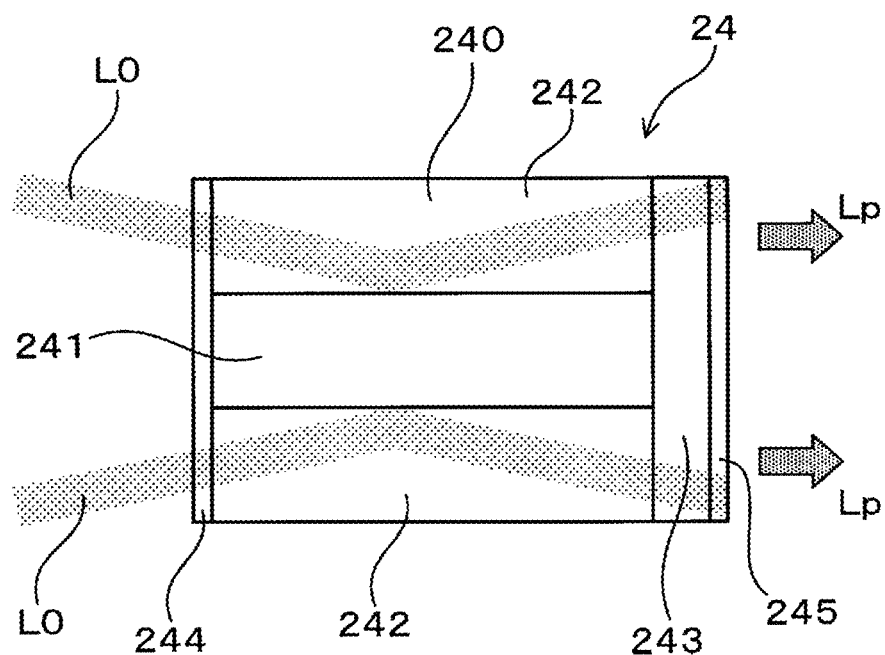
FIG. 4 is a cross-sectional diagram of a laser resonator according to the first embodiment.

As illustrated in FIG. 4, the laser resonator 24 includes a laser medium 240 and a Q switching element 243 jointed to its emission end. In addition, both end surfaces through which light passes are coated with dichroic mirrors as reflectors 244 and 245 that reflect a laser beam. Thus, the pulsed laser light Lp resonates inside the laser resonator 24. The dichroic mirror on the entrance side of the laser medium 240 (i.e., the reflector 244) transmits the excitation light L0 and reflects fluorescence within the laser medium. The dichroic mirror on the end surface adjacent to the Q switching element 243 (i.e., the reflector 245) partially reflects a fluorescence laser beam within the laser medium 240. As a result, the pulsed laser light Lp is emitted from the side adjacent to the Q switching element 243.

As illustrated in FIG. 1, the excitation light source 21 of the laser oscillation optical system 2 is located outside the laser spark plug 10. The excitation light source 21 may be, for example, a solid-state laser or a semiconductor laser. The excitation light source 21 and the laser spark plug 10 are optically connected to each other via an optical fiber 25. More specifically, one end of the optical fiber 25 is connected to the excitation light source 21, while the other end of the optical fiber 25 is connected to a proximal part of the laser spark plug 10.

Of the laser oscillation optical system 2, the axicon lens 22, the collimator lens 23, and the laser resonator 24 are located in the laser spark plug 10. More specifically, these components are fixed within the housing 4 and positioned proximally with respect to the condensing optical element 3.

In this embodiment, an enlargement lens 11 is placed between the laser resonator 24 and the condensing optical element 3 in the optical axis direction. The enlargement lens 11 directs the ring-shaped pulsed laser light Lp emitted from the laser resonator 24 to the condensing optical element 3 while enlarging the diameter of the light.

As illustrated in FIG. 4, the laser resonator 24 includes an inert medium 241 and a cylindrical medium 242 formed around the outer periphery of the inert medium 241. The inert medium 241 is formed in an area including the optical axis. The cylindrical medium 242 is a laser medium having a refractive index higher than that of the inert medium 241. The cylindrical medium 242 allows resonance to occur therein to produce the pulsed laser light Lp.

For example, the inert medium 241 may be columnar, and the cylindrical medium 242 may be tubular. However, they may have any other shape as long as the cylindrical medium 242 is formed around the outer periphery of the inert medium 241.

The inert medium 241 may be formed from, for example, YAG (yttrium aluminum garnet), $YVO_4$ (yttrium vanadate), $Al_2O_3$ (sapphire), $SiO_2$ (quartz), and $CaF_2$ (calcium fluoride). Alternatively, the inert medium 241 may also be air.

The cylindrical medium 242 may be formed from, for example, YAG or $YVO_4$ to which Nd (neodymium) or Yb (ytterbium) is added.

The excitation light L0 is applied to the laser resonator 24 in a manner to satisfy the condition that a laser beam traveling through the cylindrical medium 242 is totally reflected at the boundary surface between the inert medium 241 and the cylindrical medium 242. For example, with the cylindrical medium 242 including Nd, the inert medium 241 being air, and the excitation light L0 emitted from a YAG laser, the excitation light L0 is applied at an angle of incidence to the boundary surface being 33.1° or more.

Figure 5:
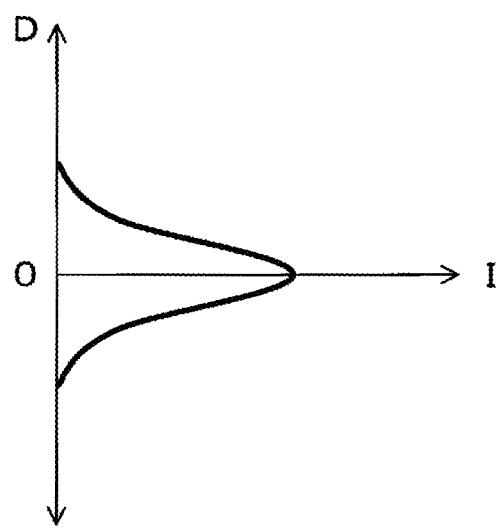
FIG. 5 is a diagram showing the intensity distribution of excitation light emitted from an excitation light source according to the first embodiment.
Figure 6:
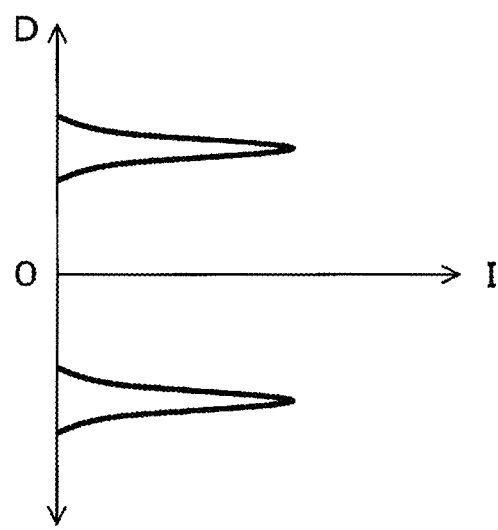
FIG. 6 is a diagram showing the intensity distribution of a pulsed laser light according to the first embodiment.

In the laser ignition device 1 according to this embodiment, as illustrated in FIG. 1, the excitation light L0 generated by the excitation light source 21 enters the proximal end of the laser spark plug 10 through the optical fiber 25. The excitation light L0 diffuses upon being emitted from the emitting end face of the optical fiber 25. In this state, the intensity distribution of the excitation light L0 is, as illustrated in FIG. 5, a Gaussian distribution with the optical axis for its center. In this figure, the vertical axis indicates radial distances D from the optical axis of the optical window 5, and the horizontal axis indicates intensities I.

The excitation light L0 having the Gaussian distribution is incident on the axicon lens 22, transformed into a ring shape, and emitted. That is, the outgoing light is the ring-shaped excitation light L0. In particular, in this embodiment, the ring-shaped excitation light L0 has an annular cross section orthogonal to the optical axis.

The ring-shaped excitation light L0 emitted from the axicon lens 22 travels while enlarging in diameter. The enlarging ring-shaped excitation light L0 is transformed by the collimator lens 23 into collimated light parallel with the optical axis. The collimated ring-shaped excitation light L0 enters the laser resonator 24.

The laser resonator 24 includes the Q switching element. The ring-shaped excitation light L0, which is the collimated light, is applied to the Q switching laser resonator 24, causing the laser resonator 24 to concentrate energy with a narrow pulse width and emit pulsed laser light Lp. The laser resonator 24, as described above, includes the inert medium 241 and the cylindrical medium 242 formed outside the inert medium 241 (see FIG. 4). The excitation light L0 is reflected back and forth while being totally reflected at the inner peripheral surface and the outer peripheral surface of the cylindrical medium 242. This achieves a reduction in energy loss of the excitation light L0. In addition, the excitation light L0 is allowed to propagate through the laser resonator 24 with the ring shape maintained, and the ring-shaped pulsed laser light Lp exits the laser resonator 24.

As illustrated in FIG. 1, the pulsed laser light Lp emitted from the laser resonator 24 is enlarged in diameter by the enlargement lens 11 and then condensed by the condensing optical element 3. The pulsed laser light Lp emitted from the condensing optical element 3 passes through the optical window 5 and travels into the combustion chamber 6. In this process, the pulsed laser light Lp passes through the enlargement lens 11, the condensing optical element 3, and the optical window 5 in their outer peripheral areas distant from the optical axis. The pulsed laser light Lp then comes into a focus FP in the combustion chamber 6.

FIG. 2 shows the position in the optical window 5 through which the pulsed laser light Lp passes. The pulsed laser light Lp through the optical window 5 has an intensity distribution shown in FIG. 6. In this figure, the vertical axis indicates radial distances D from the optical axis of the optical window 5, and the horizontal axis indicates intensities I. More specifically, the intensity distribution of the pulsed laser light Lp appears at a distance from the optical axis and near the outer periphery.

The pulsed laser light Lp brought into the focus FP in the combustion chamber 6 concentrates high energy at the focus FP. This generates plasma in the combustion chamber 6. The generated plasma ignites the air-fuel mixture in the combustion chamber 6.

The functional effects of the present embodiment will now be described.

The laser ignition device 1 allows the pulsed laser light Lp to be shaped as a ring around the optical axis at least at the light passage position in the optical window 5 (see FIG. 2). The ring shape enables the pulsed laser light Lp to pass through not the central area of the optical window 5 (i.e., near the optical axis) but the outer periphery.

Figure 7:
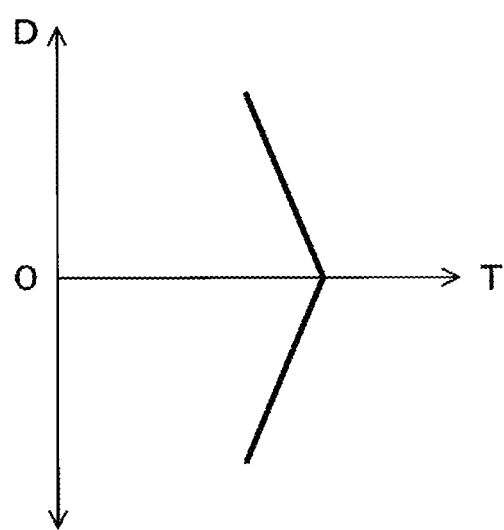
FIG. 7 is a diagram showing the temperature distribution of the optical window according to the first embodiment.

As described above, the optical window 5 is more likely to have adhesion or accumulation of deposits on the central area of the optical window 5 than on the outer peripheral area. In other words, deposits are less likely to adhere to or accumulate on and near the outer peripheral area of the optical window 5. The optical window 5 is fixed with its outer edge on the distal end of the housing 4. Thus, as illustrated in FIG. 7, the outer peripheral area of the optical window 5 is less likely to be too hot, while the central area is likely to be hotter. In this figure, the vertical axis indicates distances D from the center (optical axis) of the optical window 5, and the horizontal axis indicates temperatures T.

The pulsed laser light Lp is thus shaped as a ring so as to pass through the outer peripheral area. As a result, even if deposits adhere to the optical window 5, the intensity of light condensed into the combustion chamber 6 can be prevented from lowering.

In this embodiment, the laser oscillation optical system 2 includes the axicon lens 22. This enables the excitation light L0 to be easily and effectively shaped as a ring.

The laser oscillation optical system 2 includes the excitation light source 21, the axicon lens 22, the collimator lens 23, and the laser resonator 24. The configuration enables the excitation light L0 before the amplification by the laser resonator 24 to be shaped as a ring through the axicon lens 22. Thus, even if the excitation light L0 comes into a focus in the laser oscillation optical system 2 at a distal position with respect to the axicon lens 22, no plasma and thus no loss of energy occur. Accordingly, after the emission from the laser oscillation optical system 2, the intensity of light condensed in the combustion chamber 6 can be prevented from lowering. More specifically, high intensity of condensed light can be achieved in the combustion chamber 6 to improve the ignitability.

The laser resonator 24 includes the inert medium 241 and the cylindrical medium 242, and the cylindrical medium 242 allows resonance to occur therein to produce the pulsed laser light Lp. Thus, the ring-shaped excitation light L0 excites the active medium of the laser resonator 24 (i.e., the cylindrical medium 242), allowing the laser resonator 24 to emit the ring-shaped pulsed laser light Lp. The excitation light L0 can excite the cylindrical medium 242 while efficiently reflecting from the boundary surface between the inert medium 241 and the cylindrical medium 242. As a result, high intensity pulsed laser light Lp can be emitted without causing loss of energy in the laser resonator 24.

Thus, the present embodiment provides a laser ignition device capable of preventing a reduction in the intensity of light condensed in the combustion chamber.

Second Embodiment

A laser ignition device 1 according to the present embodiment, as illustrated in FIGS. 8 to 12, has a laser oscillation optical system 2 that includes a surface emitting laser 210 as an excitation light source 21.

Figure 9:
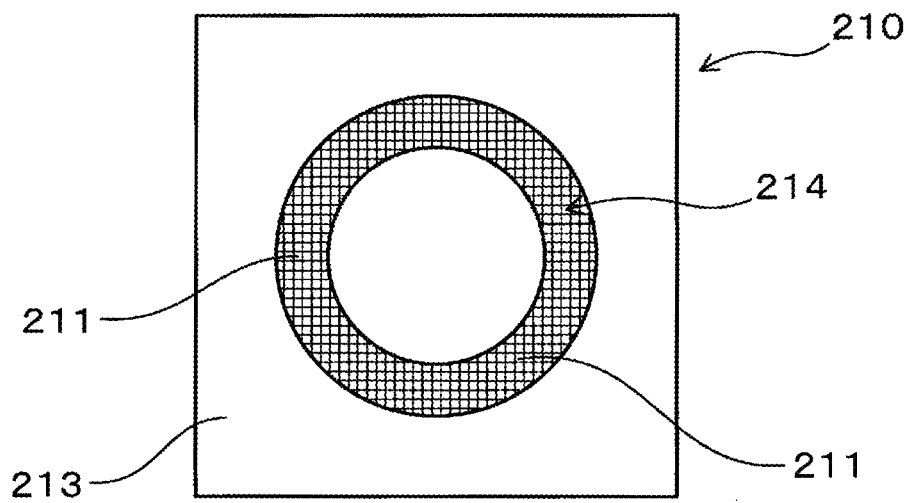
FIG. 9 is a plan view illustrating a surface emitting laser as viewed in the optical axis direction according to the second embodiment.
Figure 10:
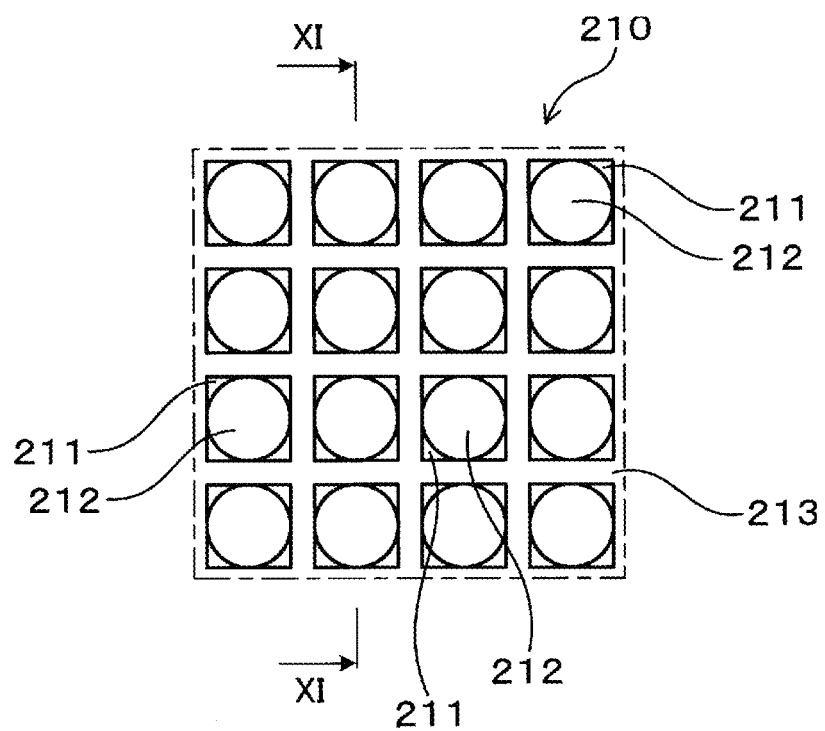
FIG. 10 is an enlarged plan view illustrating a part of the surface emitting laser as viewed in the optical axis direction according to the second embodiment.
Figure 11:
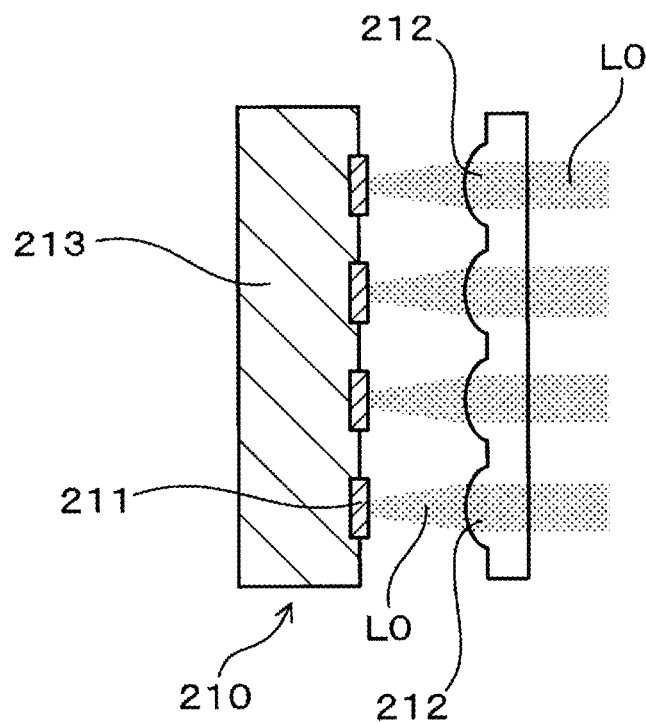
FIG. 11 is a diagram corresponding to a cross-sectional view taken in the arrow direction of line XI-XI in FIG. 10.

The surface emitting laser 210, as illustrated in FIGS. 9 to 11, includes a large number of light emitting elements 211 arranged in a plane. The surface emitting laser 210 is configured to emit excitation light L0 shaped as a ring around the optical axis.

More specifically, as illustrated in FIG. 9, the surface emitting laser 210 has the many light emitting elements 211 arranged in an annular area 214 included in a semiconductor substrate 213. In the annular area 214, as illustrated in FIG. 10, the many light emitting elements 211 are arranged along the main surface of the semiconductor substrate 213. Each light emitting element 211 emits excitation light L0 in the direction of the normal to the main surface of the semiconductor substrate 213.

However, the excitation light L0 directly emitted from each light emitting element 211 spreads radially. To turn the excitation light L0 into collimated light, as shown in FIG. 11, microlenses 212 are arranged next to the emission surfaces of the light emitting elements 211. This arrangement causes the many light emitting elements 211 to emit the excitation light L0 in the direction of the normal to the semiconductor substrate 213. Since the many light emitting elements 211 form a ring shape, the surface emitting laser 210 emits the excitation light L0 shaped as a ring.

The surface emitting laser 210 is a vertical cavity surface emitting laser (or VCSEL).

Figure 8:
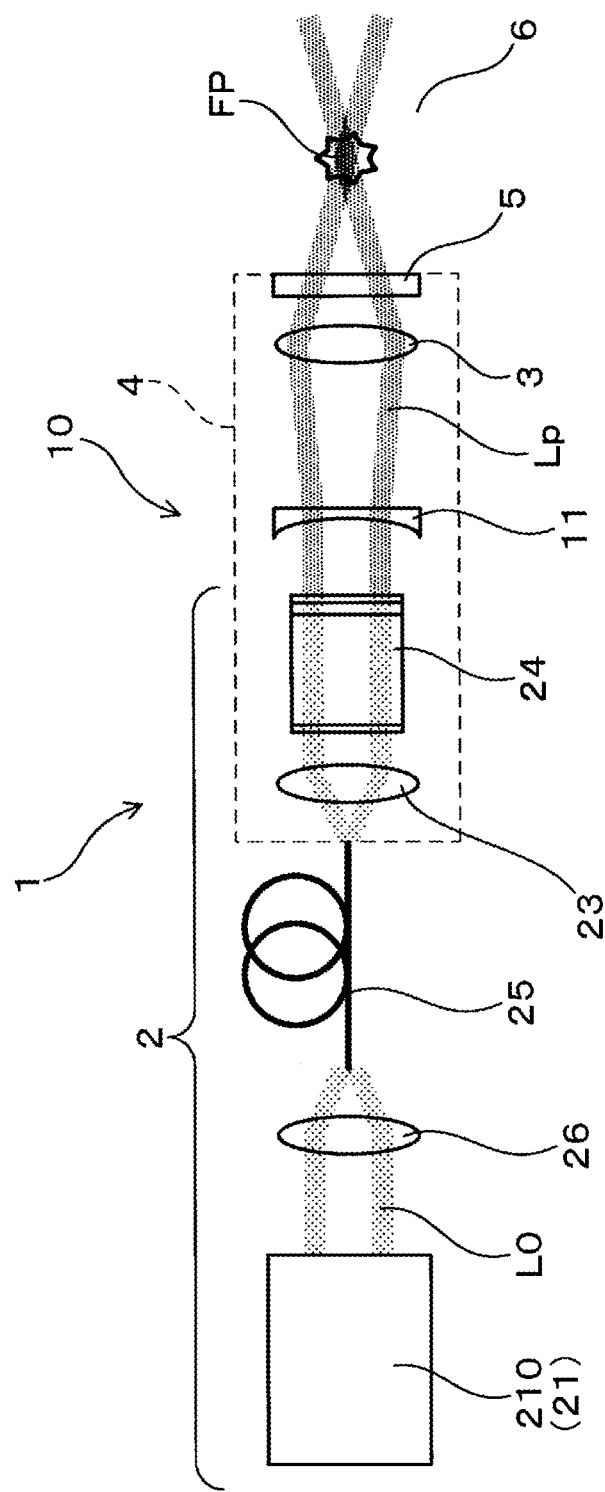
FIG. 8 is a schematic diagram illustrating a laser ignition device according to a second embodiment.

As illustrated in FIG. 8, a condenser lens 26 is placed between the surface emitting laser 210 and an optical fiber 25. The ring-shaped excitation light L0 emitted from the surface emitting laser 210 is condensed by the condenser lens 26 toward the entrance end face of the optical fiber 25. The excitation light L0 then propagates through the optical fiber 25 to a laser spark plug 10. The excitation light L0 emitted from the optical fiber 25 spreads radially with the ring shape maintained.

The excitation light L0 applied to the laser spark plug 10 is transformed into collimated light by a collimator lens 23.

Also in this embodiment, the laser oscillation optical system 2 includes a laser resonator 24. The laser resonator 24 is excited by the excitation light L0 from the surface emitting laser 210 to emit pulsed laser light Lp. As in the first embodiment, the laser resonator 24 includes an inert medium 241 and a cylindrical medium 242, and the cylindrical medium 242 allows resonance to occur therein to produce the pulsed laser light Lp (see FIG. 4).

The excitation light L0 collimated by the collimator lens 23 excites the laser resonator 24, and the laser resonator 24 emits ring-shaped pulsed laser light Lp. The pulsed laser light Lp, as in the first embodiment, passes through an enlargement lens 11, a condensing optical element 3, and an optical window 5 and comes into a focus FP in the combustion chamber 6. This ignites the air-fuel mixture in the combustion chamber 6.

In the second and subsequent embodiments, the same reference numerals as used in a previous embodiment indicate the same items as described in the previous embodiment, unless otherwise specified.

Also in this embodiment, the ring-shaped pulsed laser light Lp passes through the optical window 5. Thus, deposit adhesion and accumulation on the optical window 5 can be reduced to prevent a reduction in the intensity of light condensed into the combustion chamber 6.

In this embodiment, the excitation light L0 is shaped as a ring outside the laser spark plug 10. Accordingly, the distance from the emission end of the optical fiber 25 to the optical window 5 on the laser spark plug 10 may be shortened, allowing a reduction in the influence of a possible shift in the optical axis due to pressure and vibration received from the engine. In addition, the laser spark plug 10 installed in the engine may be shorter. Furthermore, the number of optical elements in the laser spark plug 10 may be reduced, thus enabling a shift in the optical axis to be easily reduced during installation.

Additionally, this embodiment has the same functional effects as in the first embodiment.

Third Embodiment

Figure 12:
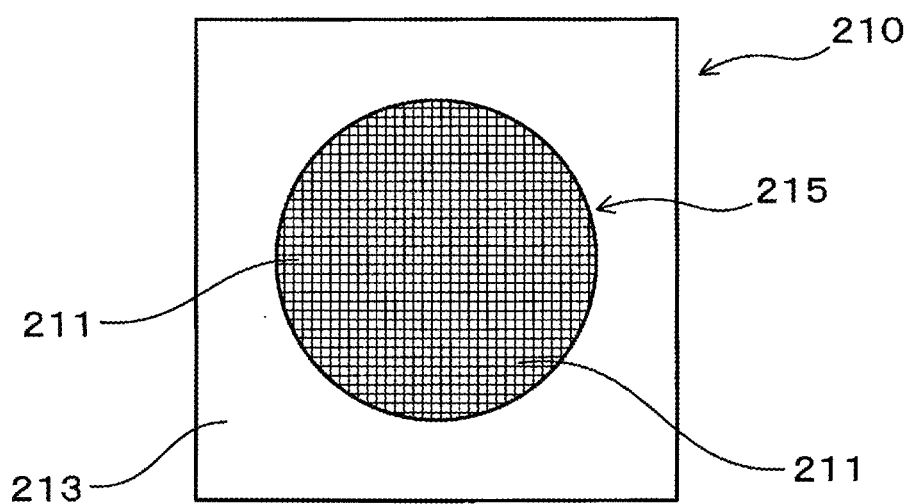
FIG. 12 is a plan view illustrating a surface emitting laser as viewed in the optical axis direction according to a third embodiment.
Figure 13:
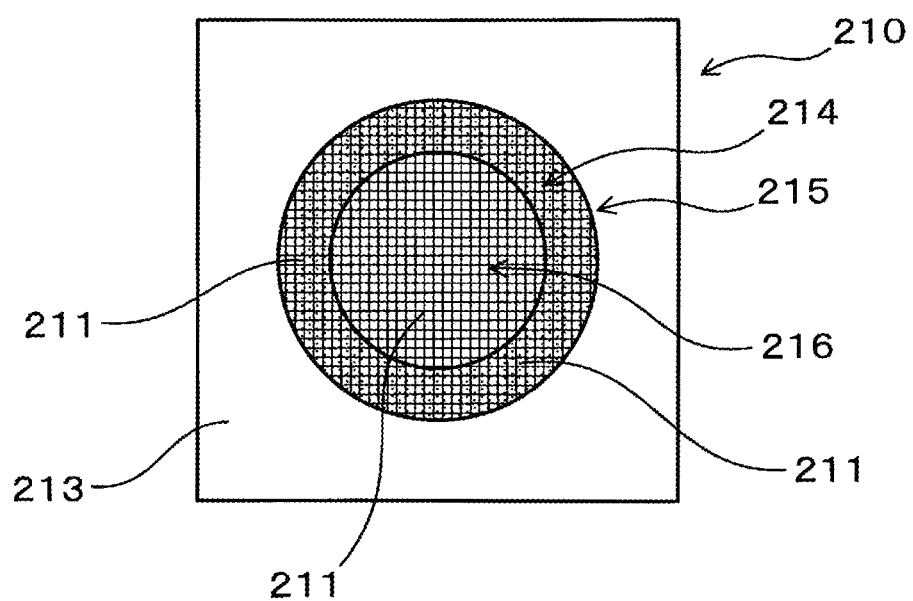
FIG. 13 is a plan view illustrating the surface emitting laser in which only an annular area is emitting light according to the third embodiment.

In the present embodiment, as illustrated in FIGS. 12 and 13, many light emitting elements 211 in a surface emitting laser 210 are arranged in an annular area 214 as well as inside it.

More specifically, as illustrated in FIG. 12, the light emitting elements 211 are arranged throughout a circular area 215 on a semiconductor substrate 213.

Of the many light emitting elements 211 arranged as in FIG. 13, only the light emitting elements 211 within the annular area 214, which is a part of the outer peripheral area of the circular area 215, are allowed to emit light. When only the light emitting elements 211 within the annular area 214 emit light, the surface emitting laser 210 emits ring-shaped excitation light L0 as in the second embodiment.

The other configuration is the same as in the first embodiment.

In this embodiment, the light emitting elements 211 are also arranged in an area other than the annular area 214. This arrangement also allows the light emitting elements 211 in the area other than the annular area 214 to emit light as appropriate. More specifically, when desired light emitting elements 211 of the many light emitting elements 211 arranged in the circular area 215 are allowed to emit light as appropriate, the illumination pattern of the pulsed laser light Lp from the laser ignition device 1 may also be changed as appropriate.

For example, when the internal combustion engine is started, only the light emitting elements 211 in a central area 216 inside the annular area 214 are caused to emit light. Alternatively, the light emitting elements 211 in the entire circular area 215 including the annular area 214 may be caused to emit light. Then, only the light emitting elements 211 in the annular area 214 are caused to emit light. The illumination pattern may be controlled in such a manner.

At the startup of the internal combustion engine, condensed water may have adhered to the optical window 5. Such condensed water is likely to adhere to the outer peripheral area of the optical window 5. For this reason, upon startup, the light emitting elements 211 inside the annular area 214 may be caused to emit light in order that the pulsed laser light Lp passes through the central area of the optical window 5. In this manner, when the internal combustion engine is started, the Gaussian pulsed laser light Lp passes through the central area of the optical window 5, or an area to which condensed water is less likely to adhere, thus avoiding a reduction in the intensity of condensed light.

After the condensed water evaporates, as illustrated in FIG. 13, only the light emitting elements 211 in the annular area 214 are caused to emit light for the ring-shaped pulsed laser light Lp to pass through the optical window 5. In this manner, the pulsed laser light Lp is caused to pass through the outer peripheral area of the optical window 5, which has less deposit adhesion and accumulation, thus avoiding a reduction in the intensity of condensed light.

Additionally, this embodiment has the same functional effects as in the second embodiment.

Fourth Embodiment

Figure 14:
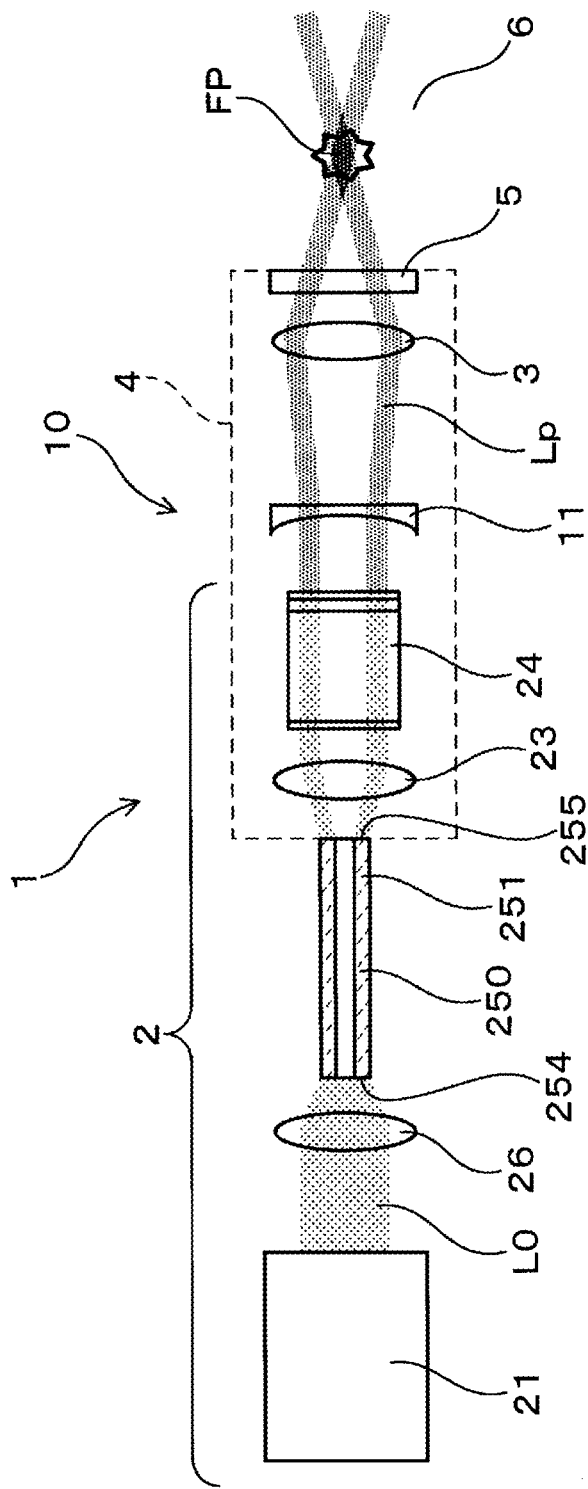
FIG. 14 is a schematic diagram illustrating a laser ignition device according to a fourth embodiment.
Figure 15:
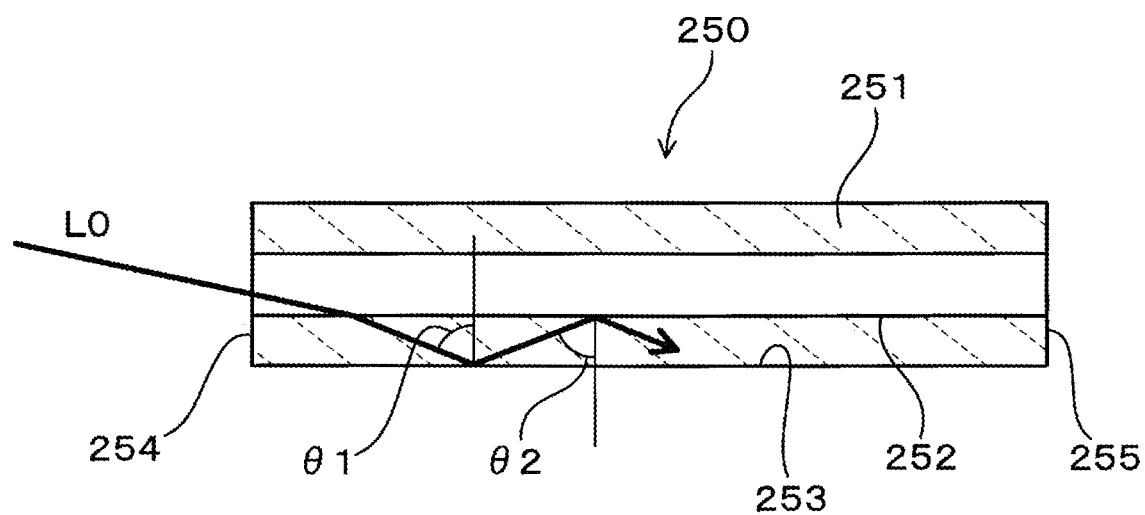
FIG. 15 is a cross-sectional diagram illustrating a cylindrical optical fiber in a longitudinal direction according to the fourth embodiment.

In the present embodiment, as illustrated in FIGS. 14 and 15, a cylindrical optical fiber 250 is provided as an optical fiber that guides excitation light L0 to a laser spark plug 10.

In this embodiment, a laser oscillation optical system 2 at least includes an excitation light source 21 that generates excitation light L0, the cylindrical optical fiber 250 that guides the excitation light L0, and a laser resonator 24 that excited by the excitation light L0 from an emitting end face 255 of the cylindrical optical fiber 250 to emit pulsed laser light Lp.

The cylindrical optical fiber 250 includes a cylindrical outer peripheral portion 251 with an annular cross section orthogonal to the longitudinal direction. The excitation light L0 guided by the cylindrical optical fiber 250 approaches the emitting end face 255 while being totally reflected at an inner peripheral surface 252 and an outer peripheral surface 253 of the cylindrical outer peripheral portion 251.

In this embodiment, the cylindrical outer peripheral portion 251 of the cylindrical optical fiber 250 has a cylindrical shape with an annular cross section orthogonal to the longitudinal direction.

In this embodiment, the cylindrical optical fiber 250 is hollow with an empty space adjacent to the inner periphery of the cylindrical outer peripheral portion 251. However, the cylindrical optical fiber 250 may not be hollow. An inner member satisfying predetermined optical conditions may be provided on the inner periphery of the cylindrical outer peripheral portion 251. The predetermined optical conditions include the condition that the inner member satisfy the relationships of refractive indexes described below with the cylindrical outer peripheral portion 251.

More specifically, when the cylindrical outer peripheral portion 251 has a refractive index of n1, and the inner member has a refractive index of n2, at least the condition that $n1 > n2 \geq 1$ is to be satisfied. Additionally, the condition is to be satisfied that the excitation light L0 propagating through the cylindrical optical fiber 250 travel while totally reflecting repeatedly inside the cylindrical outer peripheral portion 251, although it also depends on the angle of incidence of the excitation light L0 on the cylindrical optical fiber 250. More specifically, when the excitation light L0 traveling through the cylindrical outer peripheral portion 251 has an angle of incidence $\theta 2$ to the inner peripheral surface 252 of the cylindrical outer peripheral portion 251, the condition that $\sin \theta 2 > n2/n1$ is to be satisfied. In other words, the angle of the excitation light L0 applied to an entrance end face 254 of the cylindrical optical fiber 250 is designed in a manner to satisfy the above total reflection condition.

In addition, the condition that $\sin \theta 1 > 1/n1$ is required as the total reflection condition for the outer peripheral surface of the cylindrical outer peripheral portion 251. On the assumption that the cylindrical outer peripheral portion 251 is surrounded by air, the right side of the above inequality is $(1/n1)$.

If the cylindrical optical fiber 250 is hollow, $\sin \theta 2 > 1/n1$ and $\sin \theta 1 > 1/n1$.

In this embodiment, as illustrated in FIG. 14, the laser oscillation optical system 2 includes a condenser lens 26 between the excitation light source 21 and the cylindrical optical fiber 250. The optical system adjacent to the emission side of the cylindrical optical fiber 250, or the optical system in the laser spark plug 10, is substantially the same as in the second embodiment. More specifically, the emission side of the cylindrical optical fiber 250 faces the collimator lens 23, the laser resonator 24, the enlargement lens 11, the condensing optical element 3, and the optical window 5 arranged in this order. The entrance end face 254 and the emitting end face 255 of the cylindrical optical fiber 250 may be coated with an antireflection film.

In this embodiment, the excitation light L0 emitted from the excitation light source 21 is condensed by the condenser lens 26 and applied to the cylindrical optical fiber 250 from the entrance end face 254. As illustrated in FIG. 15, of the excitation light L0 applied to the cylindrical optical fiber 250 from the entrance end face 254, the excitation light L0 applied to the inside of the cylindrical outer peripheral portion 251 (e.g., the hollow space) is refracted and applied into the cylindrical outer peripheral portion 251 from the boundary surface with the cylindrical outer peripheral portion 251, or the inner peripheral surface 252 of the cylindrical outer peripheral portion 251. The excitation light L0 applied to the cylindrical outer peripheral portion 251 approaches the emitting end face 255 while totally reflecting repeatedly.

On the other hand, of the excitation light L0 applied to the cylindrical optical fiber 250 from the entrance end face 254, the excitation light L0 (not shown) directly applied to the cylindrical outer peripheral portion 251 from the entrance end face 254 approaches the emitting end face 255 while totally reflecting repeatedly in the cylindrical outer peripheral portion 251.

The excitation light L0 emitted from the emitting end face 255 travels and spreads radially at an angle to the optical axis that is substantially the same as angles of reflection to the inner peripheral surface 252 and the outer peripheral surface 253 of the cylindrical outer peripheral portion 251

(i.e., θ1, θ2). As a result, the ring-shaped excitation light L0 is emitted from the emitting end face 255.

The ring-shaped excitation light L0, as illustrated in FIG. 14, turns into ring-shaped pulsed laser light Lp through the optical system in the laser spark plug 10, passes through the optical window 5, and is condensed into the combustion chamber 6 as in the second embodiment.

The other configuration is the same as in the first embodiment.

Also in this embodiment, the ring-shaped pulsed laser light Lp passes through the optical window 5. Thus, deposit adhesion and accumulation on the optical window 5 can be reduced to prevent a reduction in the intensity of light condensed into the combustion chamber 6.

In this embodiment, as in the second embodiment, the excitation light L0 is shaped as a ring outside the laser spark plug 10. Accordingly, as in the second embodiment, the influence of a shift in the optical axis can be reduced, and the laser spark plug 10 may be shorter. Furthermore, the number of optical elements in the laser spark plug 10 may be reduced, thus enabling a shift in the optical axis to be easily reduced during installation.

Additionally, this embodiment has the same functional effects as in the first embodiment.

Fifth Embodiment

Figure 16:
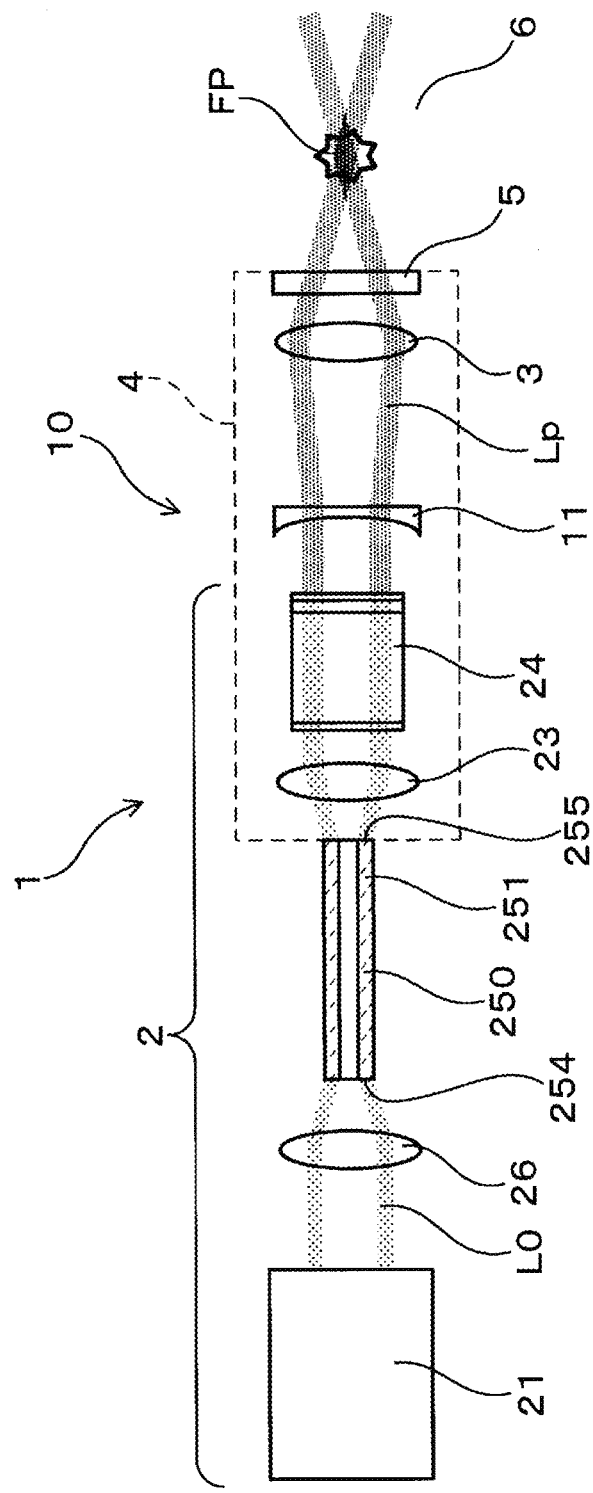
FIG. 16 is a schematic diagram illustrating a laser ignition device according to a fifth embodiment.

In the present embodiment, as illustrated in FIG. 16, excitation light L0 incident on a cylindrical optical fiber 250 has a ring shape around an optical axis.

In the fourth embodiment, the excitation light L0 having a Gaussian distribution is incident on the cylindrical optical fiber 250. In this embodiment, however, the cylindrical optical fiber 250 receives excitation light L0 already shaped as a ring enters.

As specific means, a laser oscillation optical system 2 includes a surface emitting laser 210 as an excitation light source 21. The laser oscillation optical system 2 allows ring-shaped excitation light L0 emitted from the surface emitting laser 210 to be incident on the cylindrical optical fiber 250.

As indicated in the second embodiment or the third embodiment, the surface emitting laser 210 includes a large number of light emitting elements 211 arranged in a plane. The surface emitting laser 210 is configured to emit excitation light L0 shaped as a ring around the optical axis.

The ring-shaped excitation light L0 directly enters a cylindrical outer peripheral portion 251 via an entrance end face 254 included in the cylindrical optical fiber 250.

The entrance end face 254 of the cylindrical optical fiber 250 is provided with an antireflection film (not shown).

The other configuration is the same as in the first embodiment.

In this embodiment, the excitation light L0 may be shaped as a ring before incident on the cylindrical optical fiber 250. Thus, substantially the entire excitation light L0 can be directly applied to the cylindrical outer peripheral portion 251 from the entrance end face 254 of the cylindrical optical fiber 250. This achieves a reduction in energy loss of the excitation light L0 when the excitation light L0 enters the cylindrical optical fiber 250.

Additionally, this embodiment has the same functional effects as in the first embodiment.

As a modification of the fifth embodiment, the laser oscillation optical system 2 may include an axicon lens 22 between the excitation light source 21 and the cylindrical optical fiber 250.

In this modification, ring-shaped outgoing light (excitation light L0) emitted from the axicon lens 22 may be caused to enter the cylindrical optical fiber 250. The other configuration is the same as in the fifth embodiment.

Furthermore, the above embodiments may be combined with each other as appropriate.

The present disclosure is not limited to the embodiments described above, but applicable to various embodiments without departing from the spirit and scope thereof.

Although the present disclosure has been described based on the embodiments, it is to be understood that the disclosure is not limited to the embodiments and configurations. This disclosure encompasses various modifications and alterations falling within the range of equivalence. Additionally, various combinations and forms as well as other combinations and forms with one, more than one, or less than one element added thereto also fall within the scope and spirit of the present disclosure.

What is claimed is:
1. A laser ignition device comprising:
a laser oscillation optical system configured to produce a pulsed laser light;
a condensing optical element configured to condense the pulsed laser light into a combustion chamber;
a housing internally containing the condensing optical element; and
an optical window provided distally with respect to the condensing optical element in the housing and configured to transmit the pulsed laser light, wherein
the pulsed laser light is shaped as a ring around an optical axis at least at a light passage position in the optical window,
the laser oscillation optical system includes an axicon lens configured to transform incident light into outgoing light shaped as the ring around the optical axis,
the laser oscillation optical system includes an excitation light source configured to generate excitation light, the axicon lens configured to receive and transform the excitation light into the ring-shaped outgoing light, a collimator lens configured to transform the ring-shaped outgoing light into collimated light parallel with the optical axis, and a laser resonator configured to be excited by the excitation light received as the collimated light to emit the pulsed laser light, and
the laser resonator includes an inert medium formed in an area including the optical axis and a cylindrical medium formed around an outer periphery of the inert medium, and a refractive index of the cylindrical medium is higher than a refractive index of the inert medium, and the pulsed laser light undergoes resonance in the cylindrical medium.

* * * * *